(12) United States Patent
Taylor

(10) Patent No.: US 6,174,561 B1
(45) Date of Patent: *Jan. 16, 2001

(54) COMPOSITION AND METHOD FOR PRIMING SUBSTRATE MATERIALS

(76) Inventor: James M. Taylor, 5520 Via Arboleda, Yorba Linda, CA (US) 92886

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/016,048

(22) Filed: Jan. 30, 1998

(51) Int. Cl.$^7$ ............................................. B05D 5/12
(52) U.S. Cl. ..................... 427/96; 427/302; 427/372.2; 427/388.1; 427/421
(58) Field of Search ........................... 427/96, 302, 372.2, 427/388.1, 421; 252/79.3; 148/282

(56) References Cited

U.S. PATENT DOCUMENTS

| | | |
|---|---|---|
| 3,349,043 | 10/1967 | Manning . |
| 4,127,438 | 11/1978 | Babcock et al. . |
| 4,163,727 | 8/1979 | Inks . |
| 4,281,037 | 7/1981 | Choung . |
| 4,379,834 | 4/1983 | Herwig et al. . |
| 4,656,097 | 4/1987 | Claffey et al. . |
| 5,039,472 | 8/1991 | Salensky et al. . |
| 5,077,176 | 12/1991 | Baggio et al. . |
| 5,166,037 | 11/1992 | Atkinson et al. . |
| 5,445,698 | 8/1995 | Takano et al. . |
| 5,614,324 | 3/1997 | Poutasse et al. . |
| 5,621,068 | 4/1997 | Okamoto et al. . |
| 5,665,525 | 9/1997 | Pienimaa . |
| 5,679,230 | 10/1997 | Fatcheric et al. . |

FOREIGN PATENT DOCUMENTS

| | | |
|---|---|---|
| 076197 | * 10/1980 | (EP) . |
| 57076197 | 5/1982 | (EP) . |
| 61048583 | 3/1986 | (EP) . |
| 0178864A2 | 4/1986 | (EP) . |
| 61166986 | 7/1986 | (EP) . |
| 02015185 | 1/1990 | (EP) . |
| 03229887 | 10/1991 | (EP) . |
| 2234194A | 1/1991 | (GB) . |
| WO9619097 | 6/1996 | (WO) . |
| 19097 | * 6/1996 | (WO) . |

* cited by examiner

Primary Examiner—Brian K. Talbot
(74) Attorney, Agent, or Firm—Knobbe, Martens, Olson & Bear, LLP

(57) ABSTRACT

The formulation primes materials used in the processing of substrates. The formulation comprises one or more filming amines which are mixed with and neutralized by an appropriate acid or combination of acids. Water is used as the solvent and a surfactant is optionally added to aid in the cleaning, anti-foaming and wetting of the substrates. Printed circuit boards, chemically milled alloys and chemically plated alloys can be coated with the formulation as a one-step priming method prior to lamination of a resist layer.

14 Claims, 1 Drawing Sheet

COMPOSITION AND METHOD FOR PRIMING SUBSTRATE MATERIALS

BACKGROUND OF THE INVENTION

1. Field of the Invention

The present invention relates in general to a composition of matter for preparing substrates and more specifically to an improved solution and method for priming metallic sufaces and inner layers used in the manufacture of printed circuit boards (PCBs), chemically milled alloys, and chemically plated alloys.

2. Description of Related Art

PCB fabrication requires that substrate materials be processed. In general, substrate processing is chemically performed by sequentially coating a variety of chemical solutions onto the substrates. The substrates are commonly rinsed between application of each solution and then undergo a final rinsing and drying cycle. PCB processing can include steps in which layers of materials are cleaned, scrubbed, etched, passivated, treated, masked, processed, deposited or various combinations thereof.

An initial step in the PCB fabrication process involves the cleaning and priming of substrates for subsequent application of photoresists or screen inks used to define the desired PCB circuit pattern. FIG. 1 illustrates a typical four step technique used to chemically clean and prime substrate materials. This cleaning and priming technique is merely illustrative of one of many multi-step techniques typically used in the PCB fabrication industry.

During the first step, substrates are coated with an acidic solution which functions as a cleaner and chromate remover for approximately 30 seconds to 5 minutes. This solution is usually applied at a temperature of 100 to 120 degrees fahrenheit. The substrates are then rinsed to remove excess acidic solution.

During the second step, the substrates are surface etched by coating the substrates with an etching solution, commonly persulfate or peroxy-sulfuric. Alternatively, the substrates can be physically scrubbed with pumice. Etching removes remaining chromate and roughens the surface structure of the substrate. Etching also assists in adhesion of the resist to the substrate, especially if the substrate has an underlying copper component. The substrates are then rinsed to remove the etching solution or pumice particles.

The third step varies depending on if the substrate was chemically etched or pumice scrubbed. If chemically etched, the rinse step is followed by immersion in an second acidic solution. Commonly, a 5% to 10% sulfuric acid dip or spray is used to remove oxides which tend to form on etched copper and passivates the copper. Oxide removal slows re-oxidation of the substrates during the final rinse and drying cycle which occurs prior to lamination with resist. If pumice scrubbed, a medium to high pressure rinse is used to remove the pumice particles, which otherwise would typically not be removed.

The fourth step involves coating the substrates with an oxidation inhibitor and/or adhesion promoter for the resist. Triazole solutions are commonly used for this purpose. The substrates are then rinsed and dried. At this point, the substrates are primed and properly prepared for application of a resist layer.

However, multi-step cleaning and priming techniques are time-consuming, cost-prohibitive and create additional waste products. There is thus a need for a single-step method and formulation which cleans and primes PCB substrates and, more specifically, functions as a cleaner, chromate remover, oxidation inhibitor, adhesion promotor, flexibility enhancer and redeposition inhibitor.

The chemical milling industry uses processes similar to that described above to clean and prime substrates. There is thus a need for a single-step method and compound which primes substrates used in the manufacture of chemically milled alloys.

The chemical plating industry uses processes similar to that described above to clean and prime substrates. There is thus a need for a single-step method and compound which primes substrates used in the manufacture of chemically plated alloys.

SUMMARY OF THE INVENTION

One aspect of the present invention relates to a compound and method which cleans and primes substrate materials used in the fabrication of PCBs. More specifically, the compound and method cleans, removes chromates, inhibits oxidation, promotes adhesion, inhibits attack by acids and inhibits redeposition on inner layer core substrates and flexible composite materials. The compound can be thus used to reduce the steps required to clean and prime materials used in the fabrication of PCBs to a single step.

Another aspect of the present invention relates to one or more filming amines which have unique properties when combined with a suitable acid or combination of acids. When applied to the processing of copper clad substrate materials, this solution allows for chemical bonding of resist films on smooth, non-surface etched copper and other substrate materials.

Yet another aspect of the present invention involves a formulation which allows etching of extremely fine lines and spaces found on PCBs without loss of adhesion, undercutting or micro-cracking from the flexing of the substrates.

Another aspect of the invention relates to a composition of matter for use on substrates, comprising, by weight, from about 0.003% to about 3.0% of a film forming amine(s), from about 0.02 to about 10% of a non-ionic surfactant(s), and sufficient acid(s) to produce a pH of less than about 6.5.

The invention as relates to a method of preparing a primed substrate, comprising preparing a solution comprising from about 0.003% to about 3.0% of a film forming amine and sufficient acid to produce a pH of less than about 6.5; coating at least a portion of the substrate with the solution; and drying the substrate.

Another aspect of the formulation of the present invention involves a single solution and method which cleans, inhibit oxidation and promote adhesion in chemically milled alloys and chemically plated alloys.

DETAILED DESCRIPTION OF THE PREFERRED EMBODIMENT

Figure 1:
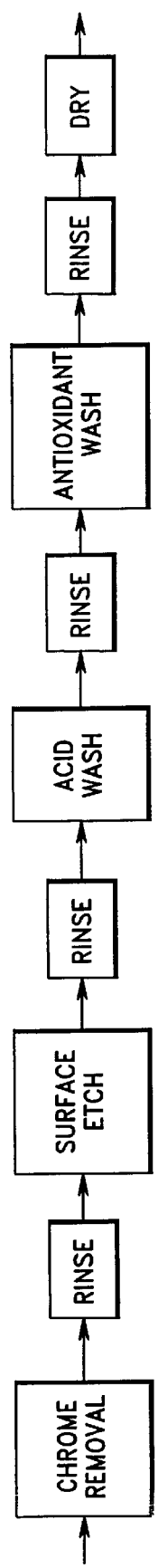
FIG. 1 is four step chemical cleaning and priming process commonly used in the prior art.
Figure 2:
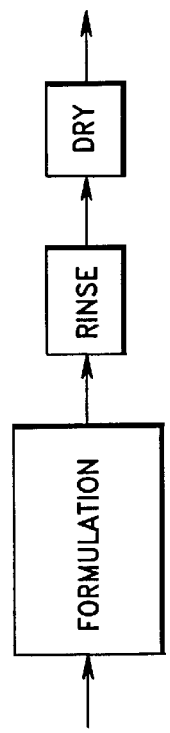
FIG. 2 is a one step chemical cleaning and priming process in accordance with the present invention.

The present invention relates to a composition and method of use which primes substrates used in the manufacture of PCBs, chemically milled alloys and chemically plated alloys. The composition allows a single step solution to prime inner layer core substrates and flexible composite materials. The solution comprises (1) a filming amine or combination of filming amines, (2) an acid or combination of acids, and (3) water. A surfactant can be optionally added to assist in cleaning, chromate removal, anti-foaming and wetting of the substrates.

For purposes of this invention, a substrate is considered to be primed when treated with a cleaner, chromate remover, oxidation inhibitor, adhesion promotor, flexibility enhancer, redeposition inhibitor, etch enhancer, wetting agent or any combination of the above. More preferably, the substrate is considered primed when treated for all of the above applications.

A filming amine is defined as a primary, secondary, tertiary or quaternary amine or derivatives thereof in which the group(s) attached to nitrogen are sufficiently hydrophobic to cause a solution of the amine, when placed upon a substrate having a charge, to form a hydrophobic layer when the pH of the formulation is below 7. An acid is defined as a compound that, when placed in pure water with a pH of 7, causes the pH to drop below 7. A surfactant is defined as a compound which lowers the surface tension of the formulation.

A wide variety of film forming amines can be used in the present invention. Preferable filming amines may be either cationic, amphoteric or nonionic. Neutral and anionic amines may also be used, but do not tend to work well unless used with a strongly acid medium. Preferable filming amines may include, but are not limited to fatty acid amines, long chain alkylamines and amino methacrylates. Amines used in the present invention can be prepared by methods known to those skilled in the art or purchased from any of a number of commercial sources. Preferable amines include, but are not limited to, primary, secondary and tertiary amines; diamines; alkylamines; C-8 through C-22 amines; basic mono cyclic tertiary amines; stabilized abietylamines; diaminopropanes; dehydroabietylamines; and ethoxylates, salts, and adducts thereof. For example, amines can be obtained from Akzo Chemicals Inc., under the tradename Armeen for primary, secondary and tertiary amines, and under the tradename Duomeen for diamines.

Fatty acid amines can be prepared by methods known to those skilled in the art by reacting fatty acids with ammonia or ammonia derivatives. The molecular structure of fatty acid amines is characterized by a central nitrogen atom as in ammonia (NH3) having one or all of its hydrogens replaced by a fatty acid group R. A fatty acid amine may also be a quaternary amine, wherein the central nitrogen atom is bonded to four fatty acid groups. Each fatty acid group, R, is a long chain, preferably C8–C22, preferably aliphatic, alkyl group having a terminal carboxylic acid function. The alkyl chain(s) of the R group may be unsaturated or have additional substituents. Because of the number of carbon atoms in the alkyl group, this group is strongly hydrophobic. However, the nitrogen atom is hydrophilic, particularly when it has four R groups or three R groups and is protonated. When dissolved or dispersed in water or non-aqueous solvents, one portion of the molecule is strongly repelled by its surrounding solvent. This repelling force tends to orient the molecules at surfaces or interfaces or cause them to form micelles.

Preferable fatty acid amines include, but are not limited to, amines having R groups derived from animal and vegetable fatty acids oroils, and oils, such as tall oil, oleic oil, caprylic oil and coconut oil. Preferable amino methacrylates include, but are not limited to dimethylaminoethly methacrylate, triethylammoniumethyl methacrylate, dimethylaminopropyl methacrylamide and methacrylamidopropyl trimethylammonium chloride.

More preferable filming amines are commercially available from Hercules, Inc. Resins Group under the trademark Polyrad. The most preferable Polyrad filming amines are Polyrad 0515 and Polyrad 1110. Other more preferable filming amines include organic monobasic cyclic tertiary amines commercially available from Mona Industries, Inc. under the tradename Monazoline. Most preferable Monozlone filming amines are Monozlone T and Monozlone C. Other more preferable filming amines are commercially available from Akzo Chemicals Inc. under the tradename Ethoduomeen. Most preferable Ethoduomeen filming amines are Ethoduomeen T/13, Ethoduomeen T/20 and Ethoduomeen T/25.

Filming amine properties particularly useful in the present invention include, but are not limited to, hydrophobicity, fast film formation, resistance to wash-off, film persistency, oxidation inhibition, adhesion promotion, cleaning, flexibility enhancement and wetting. Hydrophobicity results from the attraction between the positive charge on the filming amine and the negative charge characteristic of most substrate surfaces. Preferable filming amines form the hydrophobic film, or layer, immediately upon contact with the substrate and resist water wash-off and other film degradation. The attraction between the positively charged filming amine and negatively charged substrate surface also causes adsorption and surface modification which assists in oxidation inhibition and adhesion promotion. Also, the amphoteric molecular structure of the filming amine provides for molecular orientation at interfaces. This orientation reduces interfacial tension which assists in substrate cleaning and wetting, but also assists in foaming which is not desired. To obtain these preferred properties, the formulation can use one or more filming amines.

For example, preferable filming amines which create an adequate hydrophobic layer include Polyrad, Monozolone and Ethoduomeen. More preferable filming amines which create an adequate hydrophobic layer include Polyrad 0515, Monozolone T and Ethoduomeen T/13. Preferable filming amines which adequately inhibit foaming and wet the substrate include Polyrad and Ethoduomeen. More preferable filming amines which adequately inhibit foaming and wet the substrate include Polyrad 1110 and Ethoduomeen T/25.

To produce the formulation of the present invention, the above-described filming amine(s) are combined with a suitable acid or combination of acids. The acid(s) should be capable of reducing the formulation below a pH of 7 when introduced to the filming amine. Strong acids are preferred to weak acids only to the extent that a strong acid will reduce the formulation below a pH of 7 while introducing less acid, by volume, into the formulation than a weak acid.

Properties which acids possess which are particularly useful in the present invention include, but are not limited to, chromate removal, resistance to wash-off, adhesion promotion, cleaning, oxidation inhibition, flexibility enhancement, redeposition inhibition and wetting. To obtain these preferred properties, the formulation may use one or more acids.

For example, preferable acids for chromate removal include organic and inorganic acids. More preferable acids include phosphoric, sulfonic, and hydroxyacetic. Most preferable acids include hydrochloric, sulfuric, methane sulfonic and sulfamic. These acids are most preferred because of the rapid speed at which they attack and removes the chromate layer on the substrates. Preferable acids for resistance to wash-off and adhesion promotion include organic acids and inorganic acids. More preferable acids include formic, malonic, cuccinic, aspartic, mallic, acetic, citric, nitric, phosphoric, sulfonic, methane sulfonic, sulfamic and hydroxyacetic. Most preferable acids are gallic, maleic and funamric.

The formulation preferably comprises from about 0.0008% to 8.0%, by weight, of a filming amine(s) and an acid(s) capable of dropping the pH below 7. More preferably, the formulation comprises from about 0.003 to about 3.0%, by weight, of a filming amine(s) and an acid(s) capable of dropping the pH below 6.5.

When mixed, the filming amine(s) and acid(s) form cationic molecules with a strong positive charge which readily bond to negatively charged substrates. This bonding forms a hydrophobic layer on the substrates. The acid(s) removes chromate formed on the substrates and assists in strengthening the hydrophobic bond. The hydrophobic bond also inhibits acidic attack of the substrates to which it is bonded, but does not inhibit acidic attack on non-charged surfaces (such as a chromate layer portion of the substrate). Thus, the combination of the filming amine(s) and acid(s), forms a hydrophobic layer which assists in the removal of chromate from substrate materials. More specifically, the combination of the filming amine(s) and acid(s), forms a fast film forming, wash-off resistant, film persistent, hydrophobic layer which removes chromate conversion coatings from substrates and copper clad inner layer core materials and flexible composites. The combination also functions as a cleaner, oxidation inhibitor, adhesion promotor, flexibility enhancer, redeposition inhibitor and etch enchancer.

The formulation further comprises a carrier, or solvent, for the filming amine(s) and acid(s). The solvent preferably comprises deionized water. Ordinary tap water can be used, but is not preferred because of the extraneous metallic ions which may be found in tap water. Distilled water is not as preferred as deionized water only because of its relatively high cost. Organic solvents, such as but not limited to, glycol ethers and alcohols may be used in addition to water. Organic solvents are particularly useful to help solubilize filming amines with higher molecular weights. However, organic solvents are typically considered volatile organic compounds (VOCs) by government agencies.

The formulation optionally further comprises a surfactant. Although not required, the surfactant increases cleaning activity, assists in chromate removal, functions as a wetting agent and/or reduces foaming of the formulation. The surfactant lowers the surface tension of the formulation, preferably to less than 70 dynes/cm2, more preferably to less than 50 dynes/cm2 and most preferably to less than 30 dynes/cm2. Preferable surfactants are commercially available from Rhone-Poulene under the tradename Antrox. More preferable surfactants include Antrox LF 224 and Antarox BL-214.

The surfactant inherently increases cleansing activity and chromate removal by lowering the surface tension of the formulation. That is, the surfactant allows for quicker removal of contaminants such as, but not limited to, fingerprints, oils, greases, dirt and the like. The surfactant also speeds up the removal of the chromate layer by causing the acidic portion of the formulation to more efficiently wet the chromate. A non-ionic surfactant with an inverse solubility can also reduce foaming of the formulation. When the cloud point of the surfactant is reached (which occurs when the formulation is heated as detailed below) the surfactant begins to separate from the formulation and behave in an oil-like manner. This separation characteristic helps inhibit foaming. This anti-foaming property is especially preferred if the substrates are sprayed with the formulation.

Additionally, an etching component can be added to the formulation to speed chromate removal and/or roughen the substrate and thereby functions as an adhesion promoter for the resist. Preferable etching components include, but are not limited to, iron salts, peroxides and acids. More preferable etching components include ferric chloride and cupric chloride.

Colorants or dyes can be added to the formulation to, among other purposes, identify the formulation. Stabilizers can be added to the formulation to, among other purposes, stabilize the formulation. Perfumes can be added to the formulation to, among other purposes, cover or remove the odor of the formulation. Also, other ingredients can be added to the formulation to assist in priming the substrate, including but not limited to, cleaning, chromate removal, oxidation inhibition, adhesion promotion, flexibility enhancement, redeposition inhibition, wetting or any combination of the above.

Thus, the preferred components of the priming formulation of the present invention comprise a filming amine(s) which is mixed with an appropriate acid(s) in amounts adequate to form a hydrophobic layer on the substrate and remove a chromate layer on the substrate. Water is preferably used as the solvent and a surfactant can be optionally added to aid in the cleaning, anti-foaming or wetting of the substrates. Examples of the formulation are provided below:

EXAMPLE 1

The formulation was made by placing about 20 gallons of deionized water into a clean 50 gallon mixing tank at ambient room temperature. About 20 ounces, by weight, of Polyrad 0515 filming amine was added and stirred into the water. Then, hydrochloric acid was mixed into the solution so that the concentration of the acid, by volume, was about 50% and the concentration of the filming amine, by weight, was about 0.28%. About 5 pounds of Antarox LF 222 (a surfactant) was then mixed into the solution.

EXAMPLE 2

The formulation was made by placing about 20 gallons of distilled water into a clean 50 gallon mixing tank at ambient room temperature. About 18 ounces, by weight, of Polyrad 0515 filming amine was added and dispersed into the water. An additional 18 ounces of Polyrad 1110 filming amine was then added and dispersed into the tank to give an amine content of about 0.5%. Next, a 70% hydroxyacetic acid solution (commercially called glycolic acid) was slowly added until the solution became clear and no particles were unreacted to form a hydroxyacetic acid salt. Then, muriatic acid was mixed into the solution so that the volume of the acids was about 50% and the concentration of the filming amine was about 0.5%

EXAMPLE 3

The formulation was made by placing about 20 gallons of deionized water into a clean 50 gallon mixing tank at ambient room temperature. Monazolone T filming amine and muriatic acid was added to the tank and mixed in amounts sufficient to make the concentration of Monazoline about 0.6% and the concentration, by volume, of muriatic acid about 25%. Then, about 22 pounds, or 5% by weight, of Ferric Chloride hexahydrate was added (as an etching agent). The solution was then mixed until clear.

EXAMPLE 4

The formulation was made by placing about 2 gallons of tap water into a clean 5 gallon mixing tank at ambient room temperature. About 2 ounces, by weight, of Monazolone T filming amine was mixed with acetic acid until neutralization. Next, about 20%, by volume, of muriatic acid and 30%, by volume, of phosphoric acid was mixed into the tank. The resulting solution was then 50%, acid by volume, and about 0.08, by weight, of a filming amine. About 1% of Antarox LF 224 was mixed into the solution as a nonionic wetting agent.

EXAMPLE 5

The formulation was made by mixing about 16 gallons of distilled water and about 4 gallons of isopropyl alcohol into a clean 50 gallon mixing tank at ambient room temperature. About 18 ounces, by weight, of Ethoduomeem T/13 filming amine was added so that the concentration, by weight, of the filming amine was about 0.3%. About 1% of Antarox BL-214 was mixed.

EXAMPLE 6

The formulation was made by mixing about 20 gallons of deionized water into a clean 50 gallon mixing tank at ambient room temperature. About 20 ounces, by weight, of Ethoduomeem T/13 filming amine was added. Maleic acid was then added until neutralization. Hydrochloric acid was then added to a final acid concentration of about 50%, by weight. About 2% of Antarox LF 222 was mixed into the solution. Next, about 0.001% FD&C Blue #1 dye, about 0.001 Uranine dye and about 10%, by volume, of diethylene glycol butyl ether was added.

The formulation of the present invention is preferably prepared in the following manner. For exemplary purposes, a formulation comprising 1 filming amine, 1 acid and 1 surfactant is detailed. A clean 50 gallon container is filled with approximately 20 gallons of distilled water at ambient room temperature. Approximately 20 ounces, by weight, of Polyrad 0515 filming amine is added and stirred into the container. Stirring is preferably performed by a conventional stirring blade for approximately 10 minutes so that the filming amine is adequately dispersed in the water. When adequately dispersed, the solution becomes hazy and the filming amine particles dissociate from themselves. Then, approximately 25 gallons of hydrochloric acid is added into the container so that the amount of the acid, by volume, is 50% of the solution and the amount of the filming amine, by volume is about 0.28%. The solution is stirred for approximately 30 minutes so that the acid is adequately dispersed in the solution. When adequately dispersed, the solution has no visible particulants and a pH of 7 or below. Approximately 1%, by volume, of a Antarox LF 224 is then added and stirred into the container.

For exemplary purposes again, a formulation comprising 1 filming amine and 2 acids is detailed the solution detailed. A clean 50 gallon container is filled with approximately 20 gallons of deionized water at ambient room temperature. Approximately 20 ounces, by weight, of Polyrad 0515 filming amine is added and stirred into the container. Stirring is preferably performed by a conventional mixing blade for approximately 10 minutes so that the filming amine is adequately dispersed in the water. When adequately dispersed, the solution is hazy and the filming amine particles dissociate from themselves. Then, approximately 0.1 gallons, by volume, of hydroxyacetic acid is added and stirred into the container for approximately 10 minutes or until the mixture is neutralized. The solution is adequately stirred when its appears clear. The solution may be optionally heated to facilitate neutralization. approximately 25 gallons of hydrochloric acid is then added to the container until the final amount of the hydrochloric acid, by volume, in the solution is about 50%.

The formulation is preferably prepared in the above-described manner, stored in containers and diluted on-site for application onto substrates. The formulation is preferably diluted to 1%–25%, by volume, of its original percentage quantities and more preferably 5%–20% and most preferably about 10%.

A 10% dilution (for exemplary purposes) of the formulation is performed by the following steps. A 50 gallon container is filled with 45 gallons of water, preferably distilled. The container is preferably constructed of plastic or composites. Metal is not as preferred because it is more reactive than plastic or composites and is more readily attacked by the acid(s) in the formulation. The water is heated to approximately 55–125 degrees fahrenheit and more preferably 75–105 degrees fahrenheit and most preferably 85–95 degrees fahrenheit. 5 gallons of the formulation is then added and stirred into the container. Stirring is preferably performed by a conventional mixing blade for approximately 5 minutes so that the formulation is adequately dispersed in the water as described above. The temperature of the resulting diluted formulation is preferably readjusted to a temperature of 90–150 degrees fahrenheit and more preferably 100–130 degrees fahrenheit and most preferably 110–120 degrees fahrenheit. The diluted formulation can now be applied to a substrate.

Formulations of other concentration percentages, ranging from 1% to 25%, can be prepared in a manner similar to that disclosed above. Formulation concentrations will vary depending on several factors. Once such factor includes the time duration which the formulation will be in contact with the substrate. Typical contact times range from about 10 seconds to about 10 minutes. Another factor includes the thickness of the chromate layer. Chromate thickness varies among substrates and among substrate manufactures from about 0.001 to about 5 millimeters. Another factor which affects the preferred concentration percentage is the temperature at which the formulation is applied to the substrate. In general, the higher the temperature, the faster the chromate removal process is performed. Containers ranging in sizes from 1 gallon to 5,000 gallons can be used to prepare the diluted formulation. This range is mostly dependent upon the size and quantity of the substrates as well as the rate of speed and time duration which the substrates are in contact with the formulation.

The formulation disclosed herein functions as, but not limited to, a cleaner, chromate remover, oxidation inhibitor, adhesion promotor, flexibility enhancer, redeposition inhibitor, etch enhancer, wettor or any combination of the above.

As a cleaner, the formulation loosens and removes fingerprints, oils, greases, dirt, contaminants and the like on substrates. This provides an initial cleaning of the substrates before or as a part of substrate priming and subsequent processing.

The formulation also functions as a chromate remover. Chromate is removed from the substrate by the acid portion of the formulation and more specifically by the free hydrogen atoms therefrom.

The formulation also functions as an oxidation inhibitor. Oxidation is inhibited by the hydrophobic layer formed by the formulation onto the substrate which functions as barrier between the substrate and oxygen sources such as acid fumes and the environment.

The formulation also promotes adhesion of resists to the substrates. The hydrophobic layer which displaces the chromate on the substrate functions as a chemical bonding agent for resists. Resists usually comprise photoresists or screen inks and are typically applied after the substrate is primed to define the circuit images. Adhesion is especially improved when the formulation is applied to copper clad substrate surfaces. This adhesion greatly reduces, if not entirely eliminates, problems arising from marginal adhesion to thin substrates.

The formulation also dispenses with the requirement for a surface etch. Surface etches commonly performed on substrates used in PCB processing. A surface etch is not required due to the strength of the chemical bond between the filming amine layer and the resist. The strength of the chemical bond is especially strong when the substrate is metallic, except for chrome. Thus, copper material can be used as a substrate because of the substantial reduction in copper removal from the substrate. Additionally, an etching component, such as an iron salt, can be mixed with the formulation or incorporated into the formulation to provide faster chromate removal and/or greater adhesion of the resist (as discussed above).

The formulation also functions as a redeposition inhibitor. Redeposition of chromate, contaminants and the like is inhibited by the hydrophobic filming amine layer which the formulation forms onto the substrates.

The formulation also functions as a flexibility enhancer. On normal copper clad substrate materials, photoresists suffer the catalytic effect of the metal at the copper/resist interface. This catalytic effect, after exposure to actinic radiation in the ultraviolet portion of the spectrum, can cause free radical polymerization at the adhesion boundary. This results in a certain degree of brittleness which interferes with adhesion and flexibility of the film. Brittleness hinders removal of the last molecular layer of resist from the copper during stripping. However, photoresists bonded to the hydrophobic layer created by the formulation, do not contact the copper, allowing the copper to retain significant flexibility after exposure to actinic radiation. If a neutral screen ink is used instead of a photoresist, no such catalytic effect occurs. Flexibility of the copper substrate provides resistance to cracking and breaking of the substrate or portions thereof when flexed.

The process of using the formulation to prime substrate materials used in PCB fabrication comprises preparing the formulation, coating at least a portion of the substrates with the formulation, rinsing the substrates and then drying the substrates. This process is detailed below.

Preparing the formulation, whether in concentrated or diluted form, is performed as explained above.

The substrates can then be coated with the formulation in a variety of ways, such as, but not limited to immersion, spraying, or waterfalling. Irrespective of the coating technique used, the container which holds the formulation is preferably dimensioned and arranged to be integrated into an assembly line type operation so that substrate coating is also part of the assembly operation. The preferred immersion time varies between 20 seconds to 5 minutes and more preferably until the chromate layer is removed and the substrate achieves hydrophobicity. The coating step is repeated as many times as necessary (or the substrate is coated as long as required) to adequately coat the substrate as explained above.

The substrate is then preferably rinsed to remove formulation residue and prevent spotting. However, rinsing is not required. Rinsing is performed by coating the substrates with a solution, such as, but not limited to water, organic solvents and the like. Preferably, the substrates are rinsed with distilled water or isopropyl alcohol (ISA), and more preferably deionized water. Deionized water is more preferred due to its lack of ions, cleansing speed, relatively low cost and ease of implementation into assembly operations. The rinse step is repeated as many time as necessary to adequately remove formulation residue.

The substrate is then preferably dried so that the substrate can be further processed without undesired dripping and to prevent spotting. However, there is no requirement that the substrates be dried. Most preferably the substrates are heat dried with forced air. Forced heated air is preferred due to its speed, relatively low cost and ease of implementation into assembly operations. However, other drying techniques can be used, such as, but not limited to chemicals such as ISA, ambient air, centrifuges and the like.

In addition to using the formulation for cleaning and priming substrates and inner layer core materials and flexible composite materials used in the manufacture of PCBs, the formulation can also applied to chemical milling processes. Chemical milling refers in general to fabricating metallic alloys. More specifically, chemical milling refers to processing large metallic sheets into small, discrete metallic components with intricately dimensioned patterns or voids, such as lead frames.

Chemical milling involves applying a resist to a front and/or rear side of the metallic sheet. The metallic sheet is then exposed to actinic radiation in the ultraviolet portion of the spectrum. This exposure causes the areas unprotected by the resist to be developed away, that is, completely etched through. Preferably, the metallic sheets include nickel-iron alloys, copper, nickel, cobalt, combinations thereof or the like. By this process, small, discrete metallic parts with intricately dimensioned patterns or voids are made.

The formulation of the present invention allows a single solution to, among other purposes, clean, inhibit oxidation and promote adhesion of alloys used in chemical milling manufacture. The cleaning, oxidation inhibition and adhesion promoting properties of the formulation are described above. The formulation is prepared and applied in the same manner as detailed above. The metallic sheets can thus be coated with the formulation or a diluted percentage thereof as described above before application of the resist.

In addition to using the formulation for priming substrates used in the manufacture of PCBs and chemical milling, the formulation can also applied in chemical plating processes. Chemical plating refers in general to processing metallic alloys. More specifically, chemical plating refers to depositing metallic alloys onto substrate materials.

Chemical plating involves applying a resist to a substrate or portions thereof. After the resist is applied, the substrate is exposed to actinic radiation in the ultraviolet portion of the spectrum. This exposure causes the areas unprotected by the resist to be developed away and subsequently plated. By this process, discrete metallic alloys, such as copper, tin, lead, nickel and gold and patterns thereof can be plated to substrate.

The formulation of the present invention allows a single solution to, among of purposes, clean, inhibit oxidation, protect the substrate and promote adhesion of alloys used in chemical plating manufacture. The cleaning, oxidation inhibition, substrate protection and adhesion promoting properties of the formulation are described above. The solution is prepared and applied in the same manner as detailed above. The acid most preferable is H2SO4. The substrates can thus be coated with the solution before application of the resist.

The formulation, its properties and uses illustrated and described above are provided merely as examples of the composition and method for priming circuit boards, chemical milling and chemical plating substrates in accordance with the present invention. Other changes and modifications can be made from the embodiments presented herein by those skilled in the art without departing from the spirit and scope of the invention as defined by the appended claims.

What is claimed is:

1. A method of preparing a primed substrate, comprising:
   obtaining a solution comprising from about 0.003% to about 3.0% of a film forming amine and sufficient acid to produce a pH of less than about 6.5;
   coating at least a portion of the substrate with the solution, thereby forming a hydrophobic film comprising an amine on the outer surface of the substrate; and
   forming a second coating on the hydrophobic film.

2. The method of claim 1, wherein the coating step comprises immersing the substrate in the solution.

3. The method of claim 1, wherein the coating step comprises spraying said at least a portion of the substrate with the solution.

4. The method of claim 1, additionally comprising rinsing the substrate after the coating step.

5. The method of claim 1, wherein said solution comprises a plurality of film forming amines.

6. The method of claim 1, wherein said solution comprises a plurality of acids.

7. The method of claim 1, wherein the acid is selected from the group consisting of hydrochloric, sulfuric, sulfamic, methane sulfonic, gallic, maleic and fumaric acids.

8. The method of claim 1, further comprising drying the substrate after the coating step.

9. The method of claim 5 wherein said plurality of film forming amines inhibits oxidation of said substrate.

10. The method of claim 6 wherein said plurality of acids reduces the pH of said solution to below 4.

11. The method of claim 1 wherein said film forming amine is selected from the group consisting of fatty acid amines, long chain alkylamines and amino methacrylates.

12. The method of claim 5 wherein said plurality of film forming amines is selected from the group consisting of fatty acid amines, long chain alkylamines and amino methacrylates.

13. The method of claim 1 wherein said film forming amine is selected from the group consisting of primary amines, secondary amines, tertiary amines; alkylamines; C-8 through C-22 amines; basic mono cyclic tertiary amines, stabilized abietylamines, diaminopropanes, dehydroabietylamines, and ethoxylates, salts and adducts thereof.

14. The method of claim 5 wherein said plurality of film forming amines is selected from the group consisting of primary amines, secondary amines, tertiary amines; alkylamines; C-8 through C-22 amines; basic mono cyclic tertiary amines, stabilized abietylamines, diaminopropanes, dehydroabietylamines, and ethoxylates, salts and adducts thereof.

* * * * *